US009929068B2

(12) United States Patent
Sugo et al.

(10) Patent No.: US 9,929,068 B2
(45) Date of Patent: Mar. 27, 2018

(54) FILM-LIKE WAFER MOLD MATERIAL, MOLDED WAFER, AND SEMICONDUCTOR DEVICE

(75) Inventors: Michihiro Sugo, Annaka (JP); Kazunori Kondo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1354 days.

(21) Appl. No.: 13/410,887

(22) Filed: Mar. 2, 2012

(65) Prior Publication Data

US 2012/0235284 A1  Sep. 20, 2012

(30) Foreign Application Priority Data

Mar. 16, 2011  (JP) ................. 2011-058464

(51) Int. Cl.
| | |
|---|---|
| H01L 23/00 | (2006.01) |
| B32B 27/38 | (2006.01) |
| H01L 23/29 | (2006.01) |
| C08G 59/40 | (2006.01) |
| C09D 183/14 | (2006.01) |
| C08G 77/52 | (2006.01) |
| C08K 3/36 | (2006.01) |
| C08L 63/00 | (2006.01) |

(52) U.S. Cl.
CPC ........ *H01L 23/295* (2013.01); *C08G 59/4042* (2013.01); *C08G 59/4085* (2013.01); *C08G 77/52* (2013.01); *C09D 183/14* (2013.01); *H01L 23/296* (2013.01); *C08K 3/36* (2013.01); *C08L 63/00* (2013.01); *H01L 2924/0002* (2013.01); *Y10T 428/31511* (2015.04); *Y10T 428/31663* (2015.04)

(58) Field of Classification Search
None
See application file for complete search history.

(56) References Cited

U.S. PATENT DOCUMENTS

| | | | |
|---|---|---|---|
| 3,159,601 A | 12/1964 | Ashby | |
| 3,159,662 A | 12/1964 | Ashby | |
| 3,220,972 A | 11/1965 | Lamoreaux | |
| 3,775,452 A | 11/1973 | Karstedt | |
| 6,747,115 B2 | 6/2004 | Sakuta | |
| 2002/0055550 A1* | 5/2002 | Kato | C08G 77/42 522/134 |
| 2002/0089067 A1 | 7/2002 | Crane et al. | |
| 2008/0182087 A1* | 7/2008 | Kato | C08G 77/52 428/195.1 |
| 2011/0105646 A1 | 5/2011 | Kan et al. | |
| 2011/0143092 A1* | 6/2011 | Asai | C08G 77/52 428/141 |

FOREIGN PATENT DOCUMENTS

| | | |
|---|---|---|
| DE | 10 2006 009 696 A1 | 9/2007 |
| EP | 1 953 183 A2 | 8/2008 |
| EP | 2 280 044 A1 | 2/2011 |
| JP | A-61-51858 | 3/1986 |
| JP | 2003048989 A * | 2/2003 |
| JP | 2003268203 A * | 9/2003 |
| JP | A-2009-141020 | 6/2009 |
| TW | 2011/37523 A | 11/2011 |
| WO | WO 2009/142065 A1 | 11/2009 |

OTHER PUBLICATIONS

English language machine translation JPO JP 2003048989 (2003).*
English machine translation of JP 2003268203.*
Mar. 16, 2015 Official Communication issued in European Application No. 12 001 467.5.
Japanese Office Action issued in Application No. 2011-058464; dated Jul. 25, 2013 (With Partial English-language translation).
Sep. 25, 2012 Extended European Search Report issued in European Patent Application No. 12001467.5.
Jun. 17, 2015 Office Action issued in Korean Application No. 2012-0026392.
Aug. 13, 2015 Office Action issued in Taiwanese Application No. 101108843.
European Office Action issued in Application No. 12 001 467.5; dated Nov. 15, 2013.
Oct. 24, 2016 Office Action issued in Taiwanese Patent Application No. 101108843.
May 5, 2017 Office Action in Taiwanese Application No. 101108843.

* cited by examiner

*Primary Examiner* — Kenneth Stachel
(74) *Attorney, Agent, or Firm* — Oliff PLC

(57) ABSTRACT

A film-like wafer mold material for molding a wafer in a lump, the material including a multilayer structure constituted of at least a first film layer and a second film layer provided on the first film layer, wherein the first film layer contains a silicone-backbone-containing polymer, a cross-linking agent, and a filler, and the second film layer, contains a silicone-backbone-containing polymer and a cross-linking agent, and further contains a filler in such a manner that a content rate of the filler becomes 0 or above and less than 100 when a content rate of the filler contained in the first film layer is assumed to be 100. The film-like wafer mold material has excellent transference performance with respect to a thin-film wafer with a large diameter, also has low-warp properties and excellent wafer protection performance after form shaping (after molding), and is preferably used for a wafer level package.

9 Claims, No Drawings

FILM-LIKE WAFER MOLD MATERIAL, MOLDED WAFER, AND SEMICONDUCTOR DEVICE

BACKGROUND OF THE INVENTION

1. Field of the Invention

The present invention relates to a film-like wafer mold material used for molding a wafer in a lump.

2. Description of the Related Art

A technology for sealing in a wafer level is demanded, with increasing in diameter and reducing in film thickness of a size of a wafer for use in manufacture of a semiconductor device in recent years. Therefore, besides a conventional transfer molding method using a solid type epoxy resin, a compression molding method using a liquid type epoxy resin has been suggested (Patent Publication No. WO2009-142065). However, in the transfer molding, there is concern that wire deformation may occur since a resin is flowed in a narrow portion, and there arises a problem that a filling failure is also apt to occur due to an increase in a sealing area. Further, the compression molding method has a problem that fine control in the molding range at an end face portion of a wafer is difficult and optimizing liquidity and physical properties when pouring a liquid sealing resin into a molding machine is not easy. Furthermore, warp of a molded wafer, which has been unquestioned, becomes an issue due to an increase in diameter of a wafer size and a reduction in film thickness of a wafer in recent years, and excellent wafer protection performance is demanded. Therefore, there is demanded development of a wafer mold material that enables molding a wafer in a lump without causing problems such as a filling failure on a wafer surface and has low-warp properties and good wafer protection performance after molding.

SUMMARY OF THE INVENTION

The present invention has been accomplished in view of the above-described problems, and provides a film-like wafer mold material that does not has a liquid form but a film form, enables molding a wafer in a lump (wafer molding), and has good transference performance with respect to a thin-film wafer with a large diameter in particular, good filling properties for a wafer surface before molding, and low-warp properties and good wafer protection performance after molding, and can be preferably used for a wafer level package. Moreover, it is another object of the present invention to provide a wafer molded using the film-like wafer mold material and a semiconductor device obtained by dividing the wafer into individual pieces.

In order to achieve the above-described object, there is provided a film-like wafer mold material for molding a wafer in a lump, comprising:

a multilayer structure constituted of at least a first film layer and a second film layer provided on the first film layer, wherein the first film layer contains a silicone-backbone-containing polymer, a cross-linking agent, and a filler, and the second film layer contains a silicone-backbone-containing polymer and a cross-linking agent, and further contains a filler in such a manner that a content rate of the filler becomes 0 or above and less than 100 when a content rate of the filler contained in the first film layer is assumed to be 100.

When such a wafer mold material is provided, the material enables molding a wafer in a lump (wafer molding) and has good transference performance with respect to a thin-film wafer having a large diameter since the material has a film-like form. Additionally, since the film-like wafer mold material has the multilayer structure including two types of films that are different in performance, i.e., the first film layer which is of a high-filler type superior in low-warp properties and wafer protection properties and the second film layer which is of a low-filler type that has good filling properties with respect to a wafer surface and enables molding a wafer in a lump, this material can be used as the film-like wafer mold material that has excellent wafer surface filling properties before molding and has low-warp properties and excellent wafer protection performance after molding, and it can be preferably used in a wafer-level package.

Further, it is preferable for the first film layer is an outermost layer when the wafer is molded in a lump.

If the first film layer is the outermost layer, the film-like wafer mold material that can excellently realize the wafer protection properties can be provided, which is preferable.

Furthermore, it is preferable for a thickness of the film-like wafer mold material to be 700 μm or below.

If such a thickness is used, the film-like wafer mold material, which is further superior in low-warp properties, can be provided, which is preferable.

Moreover, it is preferable for the cross-linking agent to be an epoxy compound.

If such a cross-linking agent is adopted, the first film layer can have further excellent low-warp properties and wafer protection properties, and the second film layer can have the further excellent wafer surface filling properties, which is preferable.

Additionally, it is preferable that the silicone-backbone-containing polymer has a repeating unit represented by the following general formula (1) and has a weight average molecular weight of 3,000 to 500,000,

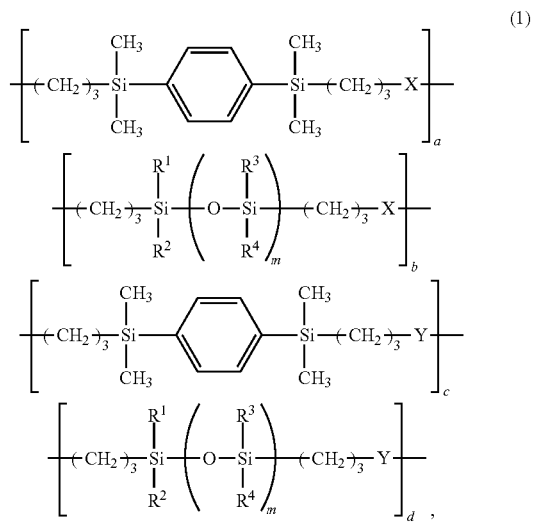

wherein $R^1$ to $R^4$ may be the same or different and represent univalent hydrocarbon groups having carbon numbers from 1 to 8; m represents an integer number from 1 to 100; each of a, b, c, and d represents 0 or a positive number, and satisfies $a+b+c+d=1$; further, each of X and Y represents a bivalent organic group represented by the following general formula (2) or the following general formula (3),

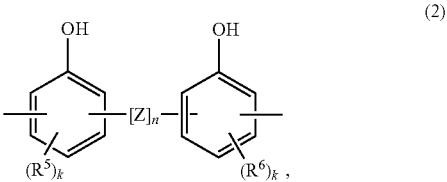
(2)

wherein Z represents a bivalent organic group selected from the following chemical structures;

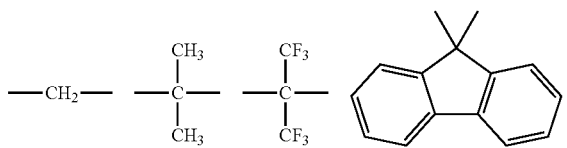

and n represents 0 or 1; each of $R^5$ or $R^6$ represents an alkyl group or an alkoxy group having a carbon number from 1 to 4, and may be the same or different; k represents any one of 0, 1, and 2,

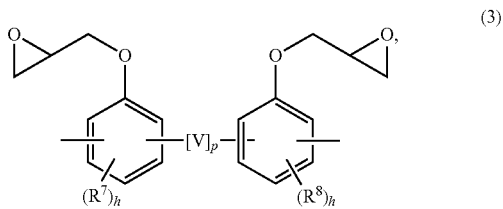
(3)

wherein V represents a bivalent organic group selected from the following chemical structures;

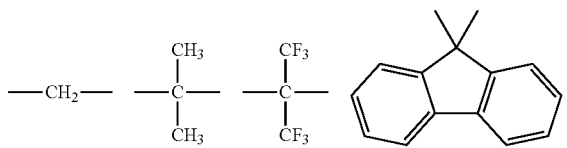

and p represents 0 or 1; each of $R^7$ and $R^8$ represents an alkyl group or an alkoxy group having a carbon number from 1 to 4, and may be the same or different; h represents any one of 0, 1, and 2.

If such a silicone-backbone-containing polymer is used, the first film layer has the further excellent low-warp properties and wafer protection properties, and the second film layer has the further excellent wafer surface filling properties, which is preferable.

Further, according to the present invention, there is provided a wafer molded in a lump with the film-like wafer mold material.

As described above, when molding using the film-like wafer mold material is carried out, the wafer that is less warped and sufficiently protected can be provided.

Furthermore, it is preferable for the wafer to be molded in a lump with the first film layer in the film-like wafer mold material being an outermost layer.

If the first film layer functions as the outermost layer, the wafer that can realize the good wafer protection properties and is protected in a further excellent manner can be provided, which is preferable.

Moreover, according to the present invention, there is provided a semiconductor device obtained by dividing the wafer into individual pieces.

The semiconductor device obtained by dividing the wafer that is less warped and sufficiently protected into individual pieces can be a high-quality semiconductor device having an excellent yield ratio.

As described above, when a film-like wafer mold material according to the present invention is provided, the material enables molding a wafer in a lump and has good transference performance with respect to a thin-film wafer having a large diameter since the material has a film-like form. Additionally, since the film-like wafer mold material has the multilayer structure including two types of films that are different in performance, i.e., the first film layer which is of a high-filler type superior in low-warp properties and wafer protection properties and the second film layer which is of a low-filler type that has good filling properties with respect to a wafer surface and enables molding a wafer in a lump, and hence this material can be used as the film-like wafer mold material that has excellent wafer surface filling properties before molding and has low-warp properties and excellent wafer protection performance after molding, and can be preferably used for a wafer-level package.

Moreover, according to the present invention, it is possible to provide the wafer that is less warped and sufficiently protected by molding using the film-like wafer mold material and also the high-quality semiconductor device having a good yield ratio that can be obtained by dividing the wafer that is less warped and sufficiently protected into respective pieces.

DETAILED DESCRIPTION OF THE PREFERRED EMBODIMENTS

Although a film-like wafer mold material, a wafer, and a semiconductor device according to the present invention will now be described in detail hereinafter, the present invention is not restricted thereto.

As described above, there has been demanded development of a wafer mold material that enables molding a wafer in a lump without causing a problem such as wafer surface filling failure and has low-warp performance and excellent protection performance after molding.

As a result of repeatedly conducting keen examination to achieve the problem, the present inventors have found out that a wafer mold material superior in low-warp properties and wafer protection properties can be provided as a filler filling ratio is increased and a wafer mold material superior in filling properties with respect to a wafer surface for molding a wafer in a lump can be provided as the filler filling ratio is decreased, and found out that the wafer mold material having functions of two film layers at the same time can be provided by containing a multilayer structure including two types of film layers different in performance, i.e., the first film layer which is of a high-filler type and the second film layer which is of a low-filler type, thereby bringing the present invention to completion. The present invention will now be described hereinafter in detail.

[Film-Like Wafer Mold Material]

That is, the present invention provides a film-like wafer mold material for molding a wafer in a lump, comprising:

a multilayer structure constituted of at least the first film layer and the second film layer provided on the first film layer, wherein the first film layer contains a silicone-backbone-containing polymer, a cross-linking agent, and a filler, and the second film layer contains a silicone-backbone-containing polymer and a cross-linking agent, and further contains a filler in such a manner that a content rate of the filler becomes 0 or above and less than 100 when a content rate of the filler contained in the first film layer is assumed to be 100.

[Film-Like Shape]

The wafer mold material according to the present invention is, formed into a film-like shape. Such a film-like wafer mold material has excellent transference performance with respect to thin-film wafer having a large diameter in particular, and a resin does not have to be inpoured when molding a wafer in a lump. Therefore, it is possible to radically dissolve problems such as wire deformation and a filling failure with respect to a wafer surface that may possibly occur in the conventional transfer molding, and such as a difficulty in control in a molding range and a problem of liquidity and physical properties of a liquid type sealing resin that may possibly occur in the compression molding method.

[Multilayer Structure]

Furthermore, the film-like wafer mold material according to has a multilayer structure constituted of at least the first film layer and the second film layer provided on the first film layer. In this manner, when two types of film layers which are different in performance, i.e., the high-filler type first film layer superior in low-warp properties and wafer protection properties and a low-filler type second film layer that has excellent filling properties with respect to a wafer surface and enables molding a wafer in a lump are used in the multilayer structure, the film-like wafer mold material that can have the performance of each of the film layers at the same time can be provided.

Further, it is preferable for the film-like wafer mold material to have a thickness of 700 μm or below. When such a thickness is adopted, the film-like wafer mold material further superior in low-warp properties can be obtained, which is preferable. Furthermore, at this time, it is preferable for the first film layer to have a thickness of 20 μm to 400 μm and the second film layer to have a thickness of 20 μm to 650 μm.

[First Film Layer]

The first film layer according to the present invention contains a silicone-backbone-containing polymer, a cross-linking agent, and a filler. The first film layer has a higher filler filling ratio than that of the second film layer, and it is therefore superior in low-warp properties and wafer protection properties. Here, it is preferable for the first film layer to be the outermost layer when a wafer is molded in a lump. When the first film layer is the outermost layer, the film-like wafer mold material that can excellently realize the wafer protection properties can be obtained, which is preferable.

[Second Film Layer]

The second film layer according to the present invention contains a silicone-backbone-containing polymer and a cross-linking agent, and further contains a filler in such a manner that a content rate of the filler becomes equal to or above 0 and less than 100 when a content rate of the filler contained in the first film layer is assumed to be 100. The second film layer has a filler filling ratio lower than that of the first film layer, and it has therefore excellent filling properties with respect to the wafer surface, thereby molding a wafer in a lump. Here, it is preferable for the second film layer to be a layer that comes into contact with the wafer surface when the wafer is molded in a lump. When the second film layer is the contact layer, the film-like wafer mold material that can excellently realize the filling properties with respect to the wafer surface can be provided, which is preferable.

[Silicone-Backbone-Containing Polymer]

The silicone-backbone-containing polymer according to the present invention is contained in the first film layer and the second film layer. Although the silicone-backbone-containing polymer is not restricted in particular as long as it is a polymer containing the silicone backbone, but a polymer having a repeating unit represented by the following general formula (1) and a weight average molecular weight of 3,000 to 500,000 is preferable. It is to be noted that one type of the silicone-backbone-containing polymer according to the present invention can be solely used or two types or more of the same can be used at the same time,

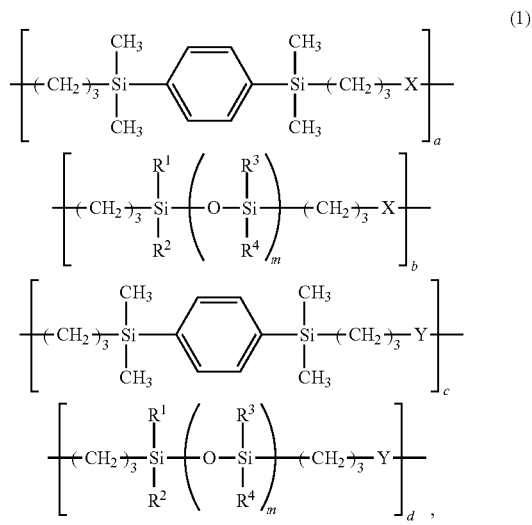

(1)

wherein $R^1$ to $R^4$ may be the same or different and represent univalent hydrocarbon groups having carbon numbers from 1 to 8; m represents an integer number from 1 to 100; each of a, b, c, and d represents 0 or a positive number, and satisfies $a+b+c+d=1$; further, each of X and Y represents a bivalent organic group represented by the following general formula (2) or the following general formula (3),

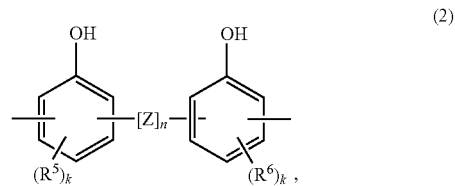

(2)

wherein Z represents a bivalent organic group selected from the following chemical structures;

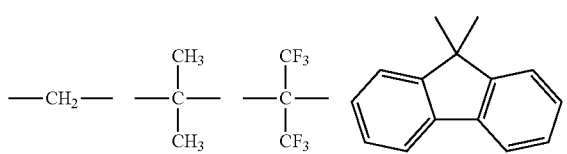

and n represents 0 or 1; each of $R^5$ or $R^6$ represents an alkyl group or an alkoxy group having a carbon number from 1 to 4, and may be the same or different; k represents any one of 0, 1, and 2,

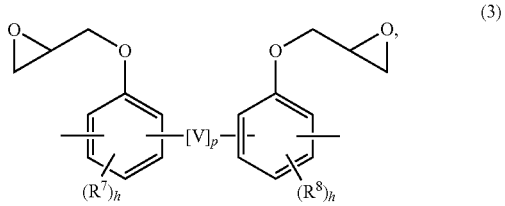

wherein V represents a bivalent organic group selected from the following chemical structures;

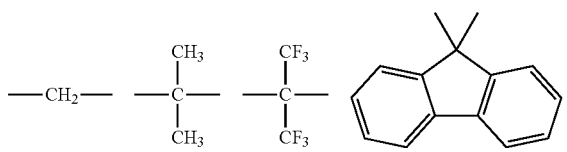

and p represents 0 or 1; each of $R^7$ and $R^8$ represents an alkyl group or an alkoxy group having a carbon number from 1 to 4, and may be the same or different; h represents any one of 0, 1, and 2.

In general formula (1), $R^1$ to $R^4$ may be the same or different and represent univalent hydrocarbon groups having carbon numbers from 1 to 8. Specifically, there are a straight-chain, branched, or cyclic alkyl group such as a methyl group, an ethyl group, a propyl group, an isopropyl group, an n-butyl group, a tert-butyl group, or a cyclohexyl group, a straight-chain, branched, or cyclic alkenyl group such as a vinyl group, an allyl group, a propenyl group, a butenyl group, a hexenyl group, or a cyclohexenyl group, an aryl group such as a phenyl group or a tolyl group, an aralkyl group such as a benzyl group or a phenylethyl group, and others.

Further, in general formula (1), m represents an integer number from 1 to 100. In particular, in view of compatibility with respect to a later-described cross-linking agent, it is preferable for m to be an integer number of 1 to 80.

Furthermore, in general formula (1), each of a, b, c, and d represents 0 or a positive number, and satisfies a+b+c+d=1. In particular, in view of adhesion properties with respect to the substrate, electrical characteristics, and reliability, a preferably meets more preferably meets $0.2 \le a \le 0.8$, or especially preferably meets $0.3 \le a \le 0.7$, b preferably meets $0 \le b \le 1.0$, more preferably meets $0.2 \le b \le 0.8$, or especially preferably meets $0.2 \le b \le 0.5$, c preferably meets $0 \le c \le 0.3$ or especially preferably meets and d preferably meets $0 \le d \le 0.3$ or preferably meets $0 \le d \le 0.2$.

In particular, in view of adhesion properties with respect to the substrate, electrical characteristics, and reliability, preferred combinations of a, b, c, and d are a combination of b=1 and a, c, and d that are all 0, a combination of $0.2 \le a \le 0.8$, $0.2 \le b \le 0.8$, and c and d that are 0, and a combination of $0.2 \le b \le 0.5$, $0 \le c \le 0.2$, and $0 < d \le 0.2$.

Moreover, in general formula (1), each of X and Y represents a bivalent organic group represented by the general formula (2) or the general formula (3). The bivalent organic group represented by the general formula (2) or the general formula (3) is a bivalent aromatic group having a phenolic hydroxyl group or a glycidoxy group.

In the general formula (2), n represents 0 or 1. Furthermore, $R^5$ and $R^6$ represent an alkyl group or an alkoxy group having carbon numbers of 1 to 4, which may be the same or different. As specific examples of $R^5$ and $R^6$, there are a methyl group, an ethyl group, an isopropyl group, a tert-butyl group, a methoxy group, an ethoxy group, an isopropyloxy group, and others. Additionally, k represents one of 0, 1, and 2.

In general formula (3), p represents 0 or 1. Further, $R^7$ and $R^8$ represent an alkyl group or an alkoxy group having carbon numbers of 1 to 4, which may be the same or different. As specific examples of $R^7$ and $R^8$, there are groups equal to $R^5$ and $R^6$. Further, h represents one of 0, 1, and 2.

A weight average molecular weight of the silicone-backbone-containing polymer represented by the general formula (1) is 3,000 to 500,000. In particular, in view of compatibility and hardenability of a hardening resin composition and mechanical characteristics of a hardened material obtained from the hardening resin composition, the range of 5,000 to 300,000 is preferable. It is to be noted that the weight average molecular weight is a polystyrene equivalent based on gel permeation chromatography (GPC) in the present invention.

The silicone-backbone-containing polymer represented by the general formula (1) can be manufactured in the presence of a catalyst by effecting a so-called "hydrosilylation" polymerizing reaction with respect to hydrogen silphenylene (1,4-bis(dimethylsilyl)benzene) of the following formula (4),

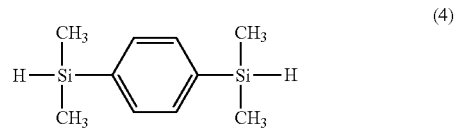

or this hydrogen silphenylene, dihydroorganosiloxane of the following general formula (5),

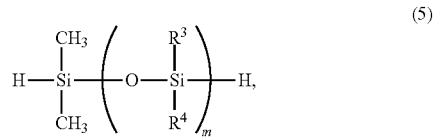

wherein $R^3$, $R^4$, and m represent equal to those described above, a specific epoxy group-containing compound having a diallyl group represented by the following general formula (6),

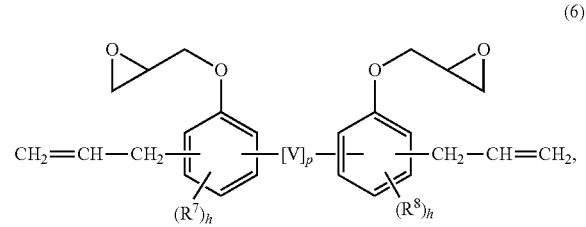

wherein V, $R^7$, $R^8$, p, and h represent equal to those described above, and a specific phenol compound having a diallyl group represented by the following general formula (7),

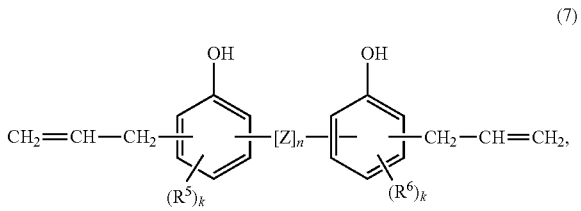

wherein Z, $R^5$, $R^6$, n, and k represent equal to those described above.

It is to be noted that the weight average molecular weight of the silicone-backbone-containing polymer represented by the general formula (1) can be readily controlled by adjusting a ratio of a total number of allyl groups of a specific epoxy group-containing compound having a diallyl group represented by the formula (6) and a specific phenol compound having a diallyl group represented by the formula (7) to a total number of hydrosilyl groups of hydrogensilphenylene represented by the formula (4) and dihydroorganosiloxane represented by the formula (5) (the total number of allyl groups/the total number of hydrosilyl groups). Alternatively, at the time of polymerization of the specific epoxy group-containing compound having a diallyl group (the formula (6)), the specific phenol compound having a diallyl group (the formula (7)), hydrogensilphenylen (the formula (4)), and dihydroorganosiloxane (the formula (5)), using a monoallyl compound such as o-allylphenol, or monohydrosilane such as triethylhydrosilane or monohydrosiloxane as a molecular weight modifier enables readily controlling the weight average molecular weight.

In the polymerizing reaction, as the catalyst, there are a platinum group metal simple substance such as platinum (including platinum black), rhodium, or palladium; platinum chloride, a chloroplatinic acid, and chloroplatinate such as $H_2PtCl.xH_2O$, $H_2PtCl_6.xH_2O$, $NaHPtCl_6.xH_2O$, $KHPtCl_6.xH_2O$, $Na_2PtCl_6.xH_2O$, $K_2PtCl_4.xH_2O$, $PtCl_4.xH_2O$, $PtCl_2$, or $Na_2HPtCl_6.xH_2O$ (in the formula, as x, an integer from 0 to 6 is preferable, and 0 or 6 is particularly preferable); an alcohol-modified chloroplatinic acid (specification in U.S. Pat. No. 3,220,972); a complex of a chloroplatinic acid and olefin (specification in U.S. Pat. No. 3,159,601, specification in U.S. Pat. No. 3,159,662, and specification in U.S. Pat. No. 3,775,452); a material obtained by supporting a platinum group metal such as platinum black or palladium by a carrier such as alumina, silica, or carbon; a rhodium-olefin complex; chlorotris (triphenylphosphine) rhodium (a so-called Wilkinson's catalyst); a complex of platinum chloride, a chloroplatinic acid, or chloroplatinate and vinyl group-containing siloxane (vinyl group-containing cyclic siloxane in particular); and others. Its amount used is a catalytic amount, and 0.001 to 0.1 mass % is usually preferable with respect to a total amount of a reactive material to be polymerized as the platinum group metal.

In the polymerizing reaction, a solvent may be used as required. As the solvent, for example, a hydrocarbon solvent such as toluene or xylene is preferable. As polymerizing conditions, from the viewpoint that a catalyst is not deactivated and polymerization can be completed in a short time, a polymerization temperature range of, e.g., 40 to 150° C. or especially 60 to 120° C. is preferable.

Depending on a type and an amount of the polymer, as a polymerization time, completing the polymerization in a period of approximately 0.5 to 100 hours or especially 0.5 to 30 hours is preferable. After completing the polymerizing reaction in this manner, the solvent is evaporated if the solvent is used, whereby the silicone-backbone-containing polymer represented by the general formula (1) can be obtained.

[Cross-Linking Agent]

The cross-linking agent according to the present invention is contained in the first film layer and the second film layer. Although not restricted in particular, an epoxy compound is preferable as the cross-linking agent. It is to be noted that the cross-linking agent according to the present invention can be solely contained, or two types or more of the same may be contained.

As a preferred example of the epoxy compound as the cross-linking agent, there are a phenol novolac-type epoxy resin, a cresol novolac-type epoxy resin, a bisphenol A type epoxy resin such as diglycidyl bisphenol A, a bisphenol F type epoxy resin such as diglycidyl bisphenol F, a triphenylmethane type epoxy resin such as triphenylolpropanetriglycidylether, a cyclic aliphatic epoxy resin such as 3,4-epoxycyclohexylmethyl-3,4-epoxycyclohexanecarboxylate, a glycidyl ester resin such as diglycidyl phthalate, diglycidyl hexahydrophthalate, or dimethyl glycidyl phthalate, a glycidyl amine resin such as tetraglycidyl diaminodiphenylmethane, triglycidyl-p-aminophenol, diglycidyl aniline, diglycidyl toluidine, or tetraglycidyl bisamino methylcyclohexane, silicone-modified epoxy, and others, and one type alone or a combination of two or more types selected from these materials can be used. Further, a monofunctional epoxy compound containing one epoxy group per molecule may be added as the cross-linking agent according to the present invention as required. When such a cross-linking agent is used, the first film layer becomes further superior in low-warp properties and wafer protection properties, and the second film layer can have further excellent filling properties with respect to a wafer surface, which is preferable.

Furthermore, when a sum total of the silicone-backbone-containing polymer and the cross-linking agent is 100 mass %, an additive amount of the cross-linking agent is preferably 3 to 80 mass % or more preferably 5 to 50 mass %.

[Filler]

The filler according to the present invention is contained in the first film layer and, when a content rate of the filler contained in the first film layer is 100, the filler is contained in the second film layer in such a manner that a content rate becomes 0 or above and less than 100. Although the filler is not restricted in particular, there are a silica fine powder, composite silicone rubber fine particles, silicone fine particles, acrylic fine particles, and others as examples of preferable use, and one type alone selected from known materials may be used, or two or more types selected from the same may be combined and used.

As the silica fine powder, for example, there are reinforcing silica such as fumed silica or precipitated silica; and crystalline silica such as quartz. Specifically, the silica fine powder is exemplified by Aerosil R972, R974, and R976 manufactured by Nippon Aerosil Co., Ltd.; SE-2050, SC-2050, SE-1050, SO-E1, SO-C1, SO-E2, SO-C2, SO-E3, SO-C3, SO-E5, and SO-C5 manufactured by Admatechs Co., Ltd.; and Musil120A and Musil130A manufactured by Shin-Etsu Chemical Co., Ltd.

As the composite silicone rubber fine particles, for example, KMP-600, KMP-605, X-52-7030 manufactured by Shin-Etsu Chemical Co., Ltd. and others can be used.

As the silicone fine particles, for example, KMP-594, KMP-597, KMP-590, and X-52-821 manufactured by Shin-Etsu Chemical Co., Ltd. and others can be used.

As the acrylic fine particles, for example, art pearl G-400, G-800, GR-400 manufactured by Negami Chemical Industrial Co., Ltd. and others can be used.

Although a content of the filler contained in the first film layer according to the present invention is not restricted in particular, when a total mass of the first film layer is assumed to be 100 mass %, the content of the filler is preferably 60 to 98 mass % or more preferably 75 to 93 mass %. Furthermore, when a content rate of the filler contained in the first film layer is assumed to be 100, as long as the content rate becomes 0 or above and less than 100, a content of the filler contained in the second film layer is preferably 0 to 90 mass % or more preferably 5 to 50 mass %. The further excellent low-warp properties and wafer protection properties can be obtained when the content of the filler contained in the first film layer is 60 mass or above, and excellent moldability can be obtained when this content is 98 mass % or below.

[Other Components]

As other components contained in the first film layer and the second film layer, various kinds of hardening accelerators may be used for the purpose of accelerating a reaction of the epoxy compound which is the cross-linking agent. As examples of the hardening accelerator, there are an organic phosphine compound such as triphenylphosphine or tricyclohexylphosphine, an amino compound such as trimethylhexamethylenediamine, diaminodiphenylmethane, 2-(dimethylaminomethyl)phenol, 2,4,6-tris(dimethylaminomethyl)phenol, or triethanolamino, and an imidazole compound such as 2-methylimidazole, 2-ethylimidazole, 2-phenylimidazole, or 2-phenyl-4,5-dihydroxymethylimidazole.

Moreover, as other components contained in the first film layer and the second film layer, carbon functional silane may be added for the purpose of improving adhesion properties with respect to a wafer.

[Support Film]

The film-like wafer mold material according to the present invention can have a support film. The support film may be a single film or a multilayer film obtained by laminating a plurality of polymer films. As a material, there is a synthetic resin film made of polyethylene, polypropylene, polycarbonate, or polyethylene terephthalate, but polyethylene terephthalate having appropriate flexibility, mechanical strength, and heat resistance is preferable. Further, these types of support films may be subjected to various kinds of processing such as a corona treatment or application of a delaminating agent. As these types of films, commercially available products can be used, and there are, e.g., Cerapeel WZ(RX) and Cerapeel BX8(R) (manufactured by Toray Advanced Film Co., Ltd.), E7302 and E7304 (manufactured by Toyobo Co., Ltd.), Purex G31 and Purex G71T1 (manufactured by Teilin DuPont Films Japan Limited), and PET38×1-A3, PET38×1-V8, and PET38×1-X08 (manufactured by Nippa Co., Ltd.).

[Protective Film]

The wafer mold material formed into a film-like shape according to the present invention can have a protective film. As the protective film, the same film as the support film can be used, but polyethylene terephthalate and polyethylene having appropriate flexibility are preferable. As these materials, commercially available products can be used, polyethylene terephthalate can be exemplified by products already described above, and polyethylene can be exemplified by GF-8 (manufactured by Tamapoly Co., Ltd.) and PE film 0 type (manufactured by Nippa Co., Ltd.).

In view of stability of the wafer mold material in manufacture and prevention of curl with respect to a winding core, which is so-called peculiar winding, a thickness of each of the support film and the protective film is preferably 10 to 100 μm or more specifically 25 to 50 μm.

[Wafer to be Molded]

A wafer to be molded using the wafer mold material according to the present invention in a lump is not restricted in particular, but it is possible to adopt either a wafer having a semiconductor element (a chip) mounted on a surface thereof or a semiconductor wafer having a semiconductor element fabricated on a surface thereof. The film-like wafer mold material according to the present invention has excellent filling properties with respect to such a wafer surface before molding, and it also has low-warp properties and excellent protection properties for such a wafer after molding. Furthermore, although the wafer mold material according to the present invention is not restricted in particular, it can be preferably used for molding a wafer having a large diameter, e.g., 8 inches (200 mm) or 12 inches (300 mm) or a thin-film wafer.

[Manufacturing Method of Film-Like Wafer Mold Material]

Although a method for Manufacturing the film-like wafer mold material according to the present invention is not restricted in particular, there are, e.g., a method for fabricating the first film layer and the second film layer and attaching these layers to each other to realize a multilayer type, a method for fabricating one of the first film layer and the second film layer and fabricating the other film layer on this film layer, and others. These manufacturing methods can be appropriately determined in view of characteristics of the first and second films, solubility, and others.

The thus-obtained film-like wafer mold material enables molding a wafer in a lump (wafer molding) and has excellent transference performance with respect to a thin-film wafer having a large diameter in particular and low-warp properties and excellent wafer protection performance after molding, and it can serve as the film-like wafer mold material that can be preferably used for a wafer level package. Further, a hardened film of the film-like wafer mold material after molding is superior in flexibility, adhesion properties, heat resistance, and electrical characteristics and has low-stress properties and wafer protection performance required for the wafer mold material, and hence this material can be preferably used as a protective mold material for a very thin wafer.

[Wafer Molding Method]

Although the method for molding a wafer using the film-like wafer mold material according to the present invention is not restricted in particular, the method can be realized by, e.g., delaminating a protective film attached to the upper side of the second film layer, using a vacuum laminator manufactured by Takatori Corporation (a product name: TEAM-100RF), setting a degree of vacuum in the vacuum chamber to 100 Pa, closely attaching the second film layer side of the film layer on the support film to the wafer at 100° C., restoring a pressure to a normal pressure, then cooling the substrate to 25° C. to be taken out from the vacuum laminator, and delaminating the support film.

[Molded Wafer]

Furthermore, the present invention provides a wafer molded in a lump with the film-like wafer mold material. When molding using the film-like wafer mold material is carried out in this way, the molded wafer that has less warp and is sufficiently protected can be obtained. Moreover, it is preferable for the wafer according to the present invention to be molded in a lump with the first film layer of the film-like wafer mold material being an outermost layer. When the first film layer is an outermost layer in this manner, the wafer protection properties can be excellently realized, and the wafer is protected in a better state, which is preferable.

[Semiconductor Device]

Additionally, the present invention provides a semiconductor device obtained by dividing the molded wafer into individual pieces. The semiconductor device obtained by dividing the wafer that is less warped and sufficiently protected into individual pieces as described above becomes a high-quality semiconductor device having a good yield rate.

EXAMPLES

Synthesis examples of the silicone-backbone-containing polymer according to the present invention, composition examples of a composition before forming the film layers according to the present invention, and examples and comparative examples of the film-like wafer mold material according to the present invention will be given below to explain the present invention in more detail, but the present invention is not restricted thereto. Chemical structure formulas of compounds (M-1) to (M-6) used in Synthesis Examples 1 and 2 of the silicone-backbone-containing polymer according to the present invention are as follows.

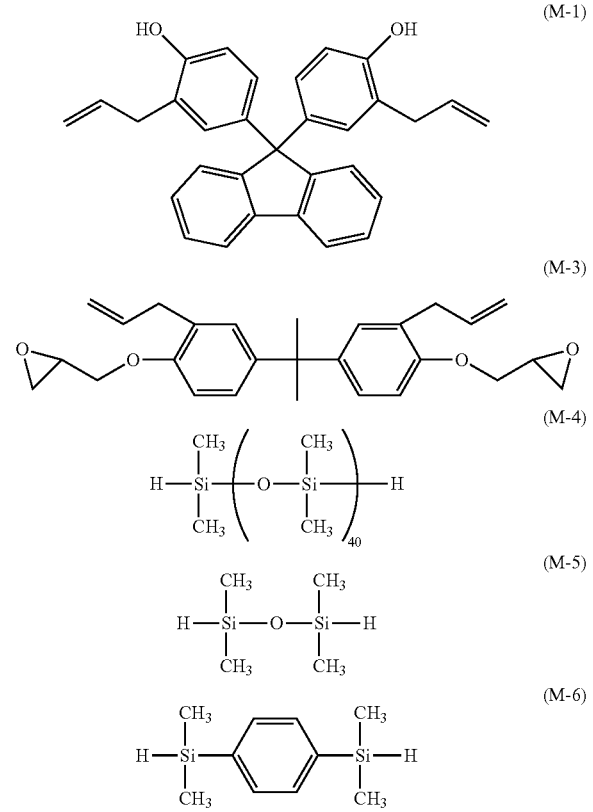

Synthesis Example 1

After dissolving 396.5 g of a compound (M-1) into 1,668 g of toluene in a 5 L flask provided with an agitator, a temperature gauge, a nitrogen replacement device, and a reflux condenser, 859.2 g of a compound (M-4) was added, and this mixture was heated to 60° C. Then, 2.2 g of a carbon-supported platinum catalyst (5 mass %) was add, an increase in internal reaction temperature to 65 to 67° C. was confirmed, then the mixture was further heated to 90° C. for three hours and again cooled to 60° C., 2.2 g of the carbon-supported platinum catalyst (5 mass %) was add, and 78.3 g of a compound (M-5) was dropped into the flask for one hour. At this time, a temperature in the flask was increased to 79° C. After end of dropping, the mixture was further ripened at 90° C. for three hours and cooled to a room temperature, 1,550 g of methyl isobutyl ketone was added, and this reaction solution was subjected to pressure filtration using a filter, thereby removing the platinum catalyst. The solvent in this silicone-backbone-containing polymer solution was evaporated under a reduced pressure, and 2,000 g of cyclopentanone was added to obtain the silicone-backbone-containing polymer solution containing cyclopentanone having a solid content concentration of 60 mass % as a main solvent. A molecular weight of the silicone-backbone-containing polymer in this silicone-backbone-containing polymer solution was measured based on GPC, a weight average molecular weight was 42,000 as a polystyrene equivalent, and a was 0, b was 1, c was 0, and d was 0 in the general formula (1).

Synthesis Example 2

After dissolving 352.8 g of the compound (M-1) and 90.0 g of a compound (M-3) into 1,875 g of toluene in the 5 L flask provided with the agitator, the temperature gauge, the nitrogen replacement device, and the reflux condenser, 949.6 g of the compound (M-4) and 6.1 g of the compound (M-5) were added, and this mixture was heated to 60° C. Then, 2.2 g of the carbon-supported platinum catalyst (5 mass %) was add, an increase in internal reaction temperature to 65 to 67° C. was confirmed, then the mixture was further heated to 90° C. for three hours and again cooled to 60° C., 2.2 g of the carbon-supported platinum catalyst (5 mass %) was add, and 107.3 g of a compound (M-6) was dropped into the flask for one hour. At this time, a temperature in the flask was increased to 79° C. After end of dropping, the mixture was further ripened at 90° C. for three hours and cooled to a room temperature, 1,700 g of methyl isobutyl ketone was added, and this reaction solution was subjected to pressure filtration using the filter, thereby removing the platinum catalyst. The solvent in this silicone-backbone-containing polymer solution was evaporated under a reduced pressure, and 980 g of cyclopentanone was added to obtain the silicone-backbone-containing polymer solution containing cyclopentanone having a solid content concentration of 60 mass % as a main solvent. A molecular weight of the silicone-backbone-containing polymer in this silicone-backbone-containing polymer solution was measured based on the GPC, a weight average molecular weight was 64,000 as a polystyrene equivalent, and a was 0.480, b was 0.320, c was 0.120, and d was 0.080 in the general formula (1).

Composition Examples 1 to 4

The following components were fed into a rotation/revolution type mixer (manufactured by Thinky Corporation) at a rate shown in Table 1, cyclopentanone was added so that a total concentration of these components can be 50 mass %, and these components were mixed, thereby preparing compositions before forming the film layers according to Composition Examples 1 to 4.

RE-310S (a bisphenol A type epoxy resin, manufactured by Japan Epoxy Resin Co., Ltd.)

Epicoat 630 (a polyfunctional epoxy resin, manufactured by Japan Epoxy Resin Co., Ltd.)

2PHZ: 2-phenyl-4,5-dihydroxymethylimidazole (manufactured by Shikoku Chemicals Corporation)

Filler: SE-2050 (manufactured by Admatechs Co., Ltd.)

TABLE 1

| | Composition | | | |
|---|---|---|---|---|
| | Composition Example 1 | Composition Example 2 | Composition Example 3 | Composition Example 4 |
| Silicone-backbone-containing polymer | Synthesis Example 1 (9 pars by mass) | Synthesis Example 1 (70.9 parts by mass) | Synthesis Example 2 (11.9 parts by mass) | Synthesis Example 2 (59.5 parts by mass) |
| Cross-linking agent | RE-310S (1 part by mass) | RE-310S (9 parts by mass) | Epicoat 630 (2.1 parts by mass) | Epicoat 630 (10.5 parts by mass) |
| Filler | SE-2050 (90 parts by mass) | SE-2050 (20 parts by mass) | SE-2050 (86 parts by mass) | SE-2050 (30 parts by mass) |
| Cross-linking accelerator | 2PHZ (0.1 part by mass) | 2PHZ (0.1 part by mass) | — | — |

[Formation of Film Layers]

A die coater as a film coater and a polyethylene terephthalate film (a thickness: 38 μm) were used, and each of the compositions before forming the film layers according to Composition. Examples 1 to 4 was applied to the upper side of the polyethylene terephthalate film. Then, this material was passed through a circulating hot air oven (a length: 4 m) set to 100° C. for five minutes to form a film layer having a film thickness of 50 μm to 400 μm on the polyethylene terephthalate film. Then, a polyethylene film (a thickness: 50 μm) was attached to the upper side of the film layer under a pressure of 1 MPa using a laminated roll, thereby fabricating each film layer.

[Formation of Multilayer]

The polyethylene film on each obtained film layer was removed, and the film layers in each combination shown in Table 2 were laminated and put into a thermal roll laminator heated to 60° C., whereby a multilayer structure was formed to obtain the film-like wafer mold material according to the present invention (Examples 1 to 3). Further, a structure constituted of the single film layer having no multilayer structure was used as a wafer mold material according to each of Comparative Example 1 and Comparative Example 2.

[Transfer onto Wafer and Molding]

A silicon wafer having a wafer thickness of 100 μm and a diameter of 8 inches (200 mm) was prepared. In each of Examples 1 to 3, a polyethylene terephthalate film (a protective film) on the second film layer side was delaminated, a vacuum laminator manufactured by Takatori Corporation (a product name: TEAM-100RF) was used, the inside of the vacuum chamber was set to a degree of vacuum 100 Pa, and the second film layer side was closely attached to the silicon wafer at 100° C. After restoring a pressure to a normal pressure, the silicon wafer was cooled to 25° C. and taken out from the vacuum laminator, and the polyethylene terephthalate film (a support film) on the first film layer side was delaminated. Further, in each of Comparative Examples 1 and 2, the same silicon wafer was used, a polyethylene film (a protective film) was delaminated, the vacuum laminator manufactured by Takatori Corporation (a product name: TEAM-100RF) was used, the inside of the vacuum chamber was set to a degree of vacuum 100 Pa, and the film layer side was closely attached to the silicon wafer at 100° C. After restoring a pressure to a normal pressure, the silicon wafer was cooled to 25° C. and taken out from the vacuum laminator, and the polyethylene terephthalate film (a support film) was delaminated.

The following table shows transference performance with respect to a wafer, wafer protection performance, and an amount of warp. It is to be noted that the transference performance with respect to a wafer were determined to be good if transference to the wafer was successful after delamination from the support film. Furthermore, in regard to the wafer protection performance, an amount of deflection of the wafer was measured when supporting an end of the wafer, a value equal to or below 20 mm was determined to be good, and a value exceeding 20 mm was determined as a failure. The amount of warp is a value obtained by measuring warp of the wafer at a wafer end with reference to a wafer center.

TABLE 2

| | Example 1 | Example 2 | Example 3 | Comparative Example 1 | Comparative Example 2 |
|---|---|---|---|---|---|
| First film layer | Composition Example 1 (Thickness: 100 μm) | Composition Example 3 (Thickness: 100 μm) | Composition Example 1 (Thickness: 50 μm) | Composition Example 1 (Thickness: 100 μm) | None |
| Second film layer | Composition Example 2 (Thickness: 400 μm) | Composition Example 4 (Thickness: 300 μm) | Composition Example 2 (Thickness: 100 μm) | None | Composition Example 4 (Thickness: 300 μm) |
| transference performance | Good | Good | Good | Non-transferable | Good |
| Wafer protection properties | Good | Good | Good | — | Poor |
| Amount of warp (mm) | <1 | <1 | <1 | — | <1 |

Based on the above result, it was revealed that Comparative Example 1 using the first film layer alone has poor transference performance and Comparative Example 2 using the second film layer alone has poor wafer protection performance. On the other hand, it was found out that Examples 1 to 3 according to the present invention having the multilayer structure including the first and second film layers can provide the film-like wafer mold material having excellent transference performance and wafer protection performance and a small amount of warp.

As described above, since the film-like wafer mold material according to the present invention has the film-like shape, it enables molding a wafer (wafer molding) in a lump, has the excellent transference performance with respect to a large-diameter thin-film wafer, and also has excellent filling properties with respect to a wafer surface before molding and low-warp properties and excellent wafer protection performance after molding at the same time because it has the multilayer structure including two types of films different from each other in performance, i.e., the high-filler type first film layer superior in low-warp properties and wafer protection properties and the low-filler type second film layer that has the excellent filling properties with respect to the wafer surface and enables molding the wafer in a lump, thereby providing the film-like wafer mold material that can be preferably used for a wafer level package.

It is to be noted that the present invention is not restricted to the foregoing embodiment. The foregoing embodiment is just an exemplification, and any examples that have substantially the same configuration and exercise the same functions and effects as the technical concept descried in claims of the present invention are included in the technical scope of the present invention.

What is claimed is:

1. A wafer mold material film for wafer molding, comprising:
a multilayer structure constituted of at least a first film layer and a second film layer provided on the first film layer,
wherein the first film layer contains a silicone-backbone-containing polymer, a cross-linking agent, and a filler,
the second film layer contains a silicone-backbone-containing polymer and a cross-linking agent, and further contains a filler in that a content rate of the filler is above 0 and less than 100 based on a content rate of the filler contained in the first film layer of 100, and
the silicone-backbone-containing polymer contained in the first film layer and the second film layer have a repeating unit a, a repeating unit b, a repeating unit c, and a repeating unit d in the following general formula (1) and has a weight average molecular weight of 3,000 to 500,000,

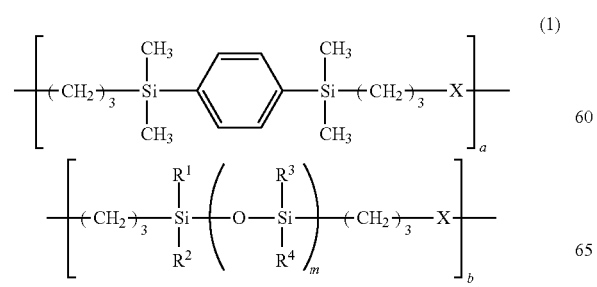

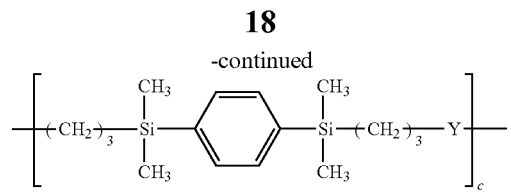

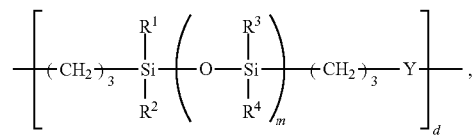

wherein $R^1$ to $R^4$ may be the same or different and represent univalent hydrocarbon groups having carbon numbers from 1 to 8; m represents an integer number from 1 to 100; each of a, b, c, and d represents a positive number, and satisfies $a+b+c+d=1$, provided that $0.3 \leq a \leq 0.7$, $0.2 \leq b \leq 0.5$, $0 < c \leq 0.2$, and $0 < d \leq 0.2$; further, X and Y are different, and each of X and Y represents a bivalent organic group represented by the following general formula (2) or the following general formula (3), and groups represented by both formula (2) and formula (3) are present,

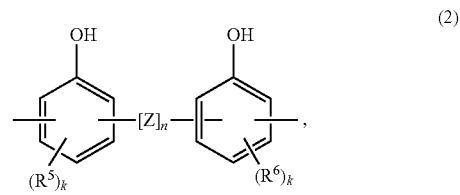

wherein Z represents a bivalent organic group selected from the following chemical structures;

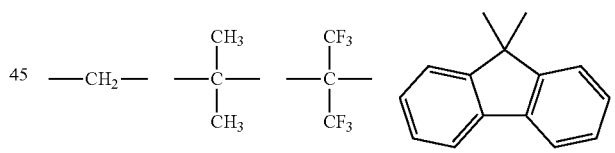

and n represents 0 or 1; each of $R^5$ or $R^6$ represents an alkyl group or an alkoxy group having a carbon number from 1 to 4, and may be the same or different; k represents any one of 0, 1, and 2,

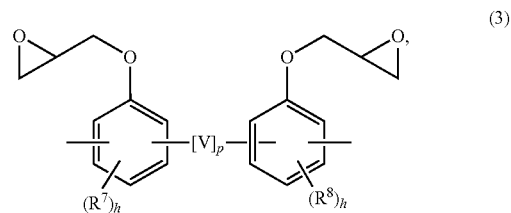

wherein V represents a bivalent organic group selected from the following chemical structures;

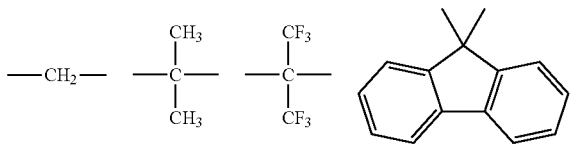

and p represents 0 or 1; each of $R^7$ and $R^8$ represents an alkyl group or an alkoxy group having a carbon number from 1 to 4, and may be the same or different; h represents any one of 0, 1, and 2.

2. The wafer mold material film according to claim 1, wherein the cross-linking agents contained in the first film layer and the second film layer are epoxy compounds.

3. The wafer mold material film according to claim 1, wherein a thickness of the first film layer is 20 μm to 400 μm and a thickness of the second film layer is 20 μm to 650 μm.

4. The wafer mold material film according to claim 1, wherein the silicone-backbone-containing polymer contained in the first film layer and the second film layer have a weight average molecular weight of 5,000 to 300,000.

5. The wafer mold material film according to claim 1, wherein the content rate of the filler in the first film layer is 60 to 98 mass % of the total mass of the first film layer.

6. The wafer mold material film according to claim 1, wherein the content of the filler in the first film layer is 75 to 93 mass % of the total mass of the first film layer.

7. The wafer mold material film according to claim 1, wherein the content rate of the filler is from 5 to 50 mass % in the second film layer based on the content rate of filler in the first film layer.

8. The wafer mold material film according to claim 1, wherein a thickness of the wafer mold material film is 700 μm or below.

9. The wafer mold material film according to claim 8, wherein the cross-linking agents contained in the first film layer and the second film layer are epoxy compounds.

\* \* \* \* \*